United States Patent
Hui et al.

(10) Patent No.: US 7,042,296 B2
(45) Date of Patent: May 9, 2006

(54) DIGITAL PROGRAMMABLE DELAY SCHEME TO CONTINUOUSLY CALIBRATE AND TRACK DELAY OVER PROCESS, VOLTAGE AND TEMPERATURE

(75) Inventors: Keven Hui, Union City, CA (US); Hong Hao, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 113 days.

(21) Appl. No.: 10/879,443

(22) Filed: Jun. 29, 2004

(65) Prior Publication Data

US 2006/0033544 A1    Feb. 16, 2006

Related U.S. Application Data

(63) Continuation-in-part of application No. 10/671,352, filed on Sep. 25, 2003, now Pat. No. 6,914,492.

(51) Int. Cl.
*H03B 5/24* (2006.01)
*H03H 11/26* (2006.01)
*H03L 7/06* (2006.01)

(52) U.S. Cl. .................. 331/17; 331/1 A; 331/25; 331/57; 327/155; 327/262

(58) Field of Classification Search ............... 331/1 A, 331/14, 17, 18, 25, 44, 57; 327/155, 161–162, 327/261–262
See application file for complete search history.

(56) References Cited

U.S. PATENT DOCUMENTS

| | | | |
|---|---|---|---|
| 5,241,429 A | 8/1993 | Holsinger | |
| 5,355,037 A | 10/1994 | Andresen et al. | |
| 6,255,879 B1 | 7/2001 | Voss | |
| 6,333,652 B1 * | 12/2001 | Iida et al. | 327/161 |
| 6,366,149 B1 | 4/2002 | Lee et al. | |

* cited by examiner

*Primary Examiner*—David Mis
(74) *Attorney, Agent, or Firm*—Suiter West Swantz PC LLO

(57) ABSTRACT

The method and circuit of the present invention compensates a timing change over PVT variations without adverse impact on the system. The method and circuit uses two digital programmable delay circuits which have a Master/Slave relationship. The master programmable delay circuit tracks a delay over PVT and readjusts the delay whenever there is a need for calibration due to PVT variations. The slave programmable delay circuit compensates the timing change by delaying the real clock signal when the master programmable delay circuit completes the delay locking process. The resulting circuit is small, flexible, PVT calibrated, and consumes very little power. It can be used with any reference clock to support various timing requirements at different frequencies.

31 Claims, 7 Drawing Sheets

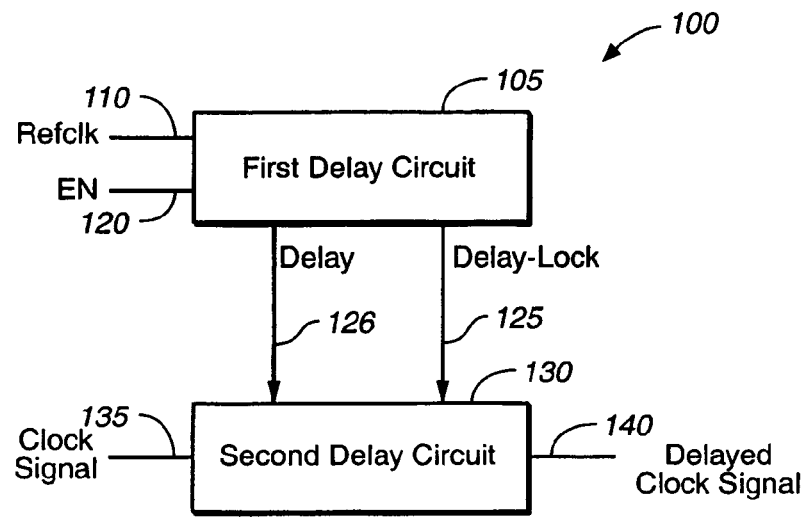
FIG._1
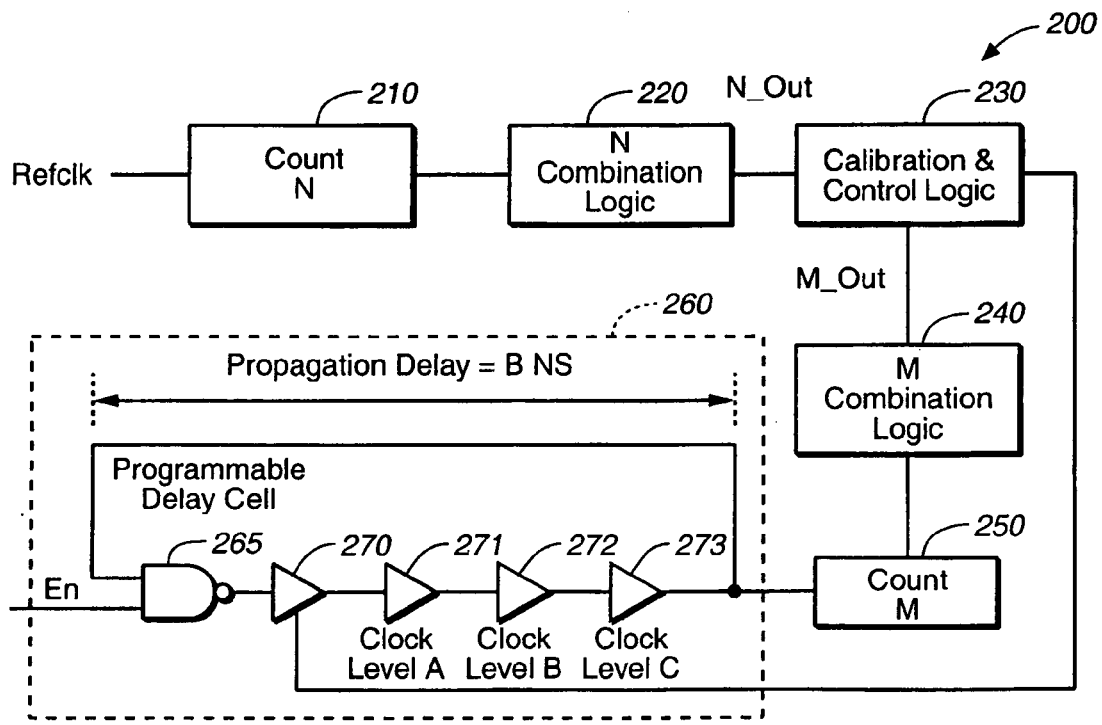
FIG._2

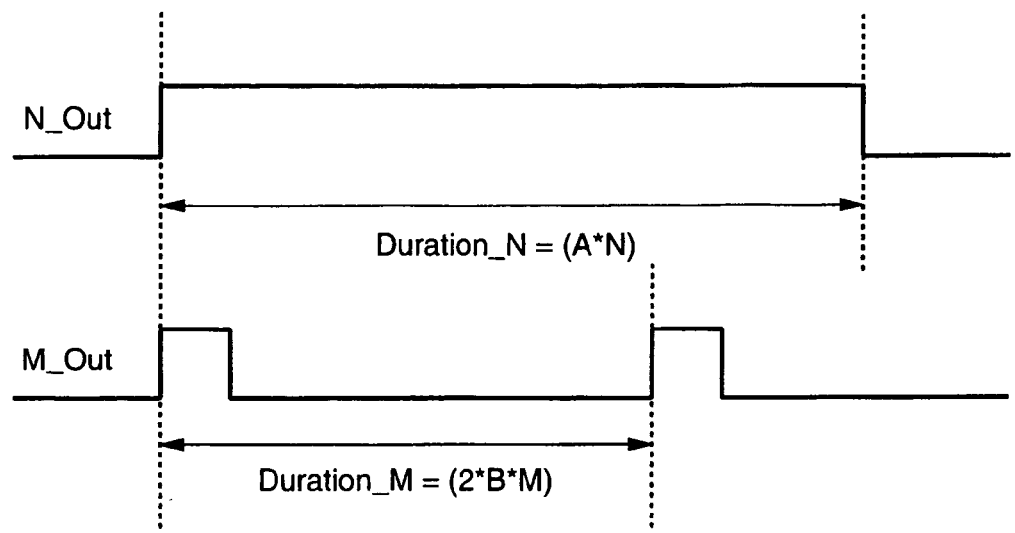
FIG._3
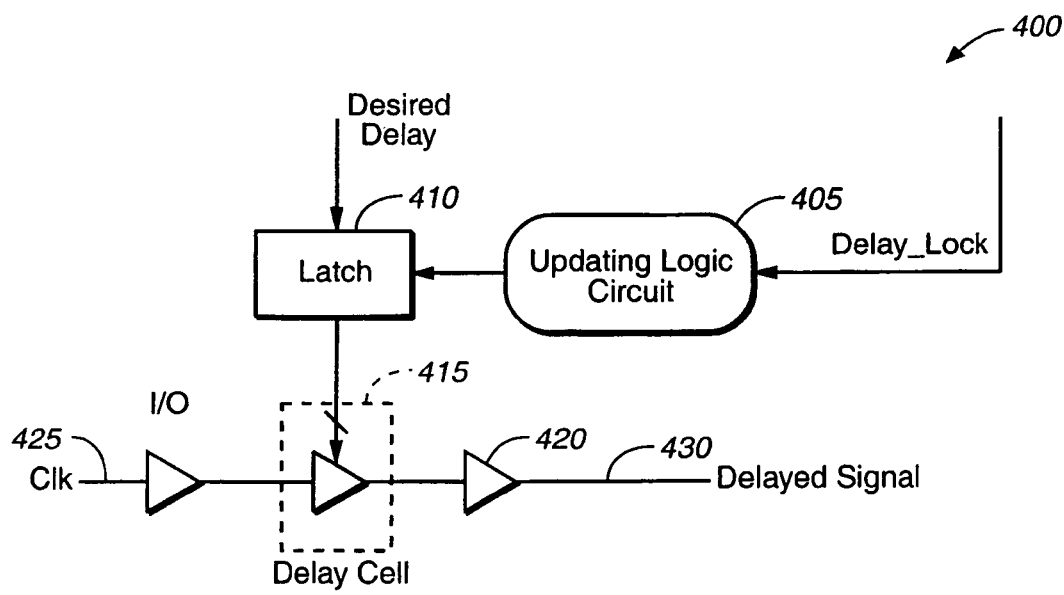
FIG._4

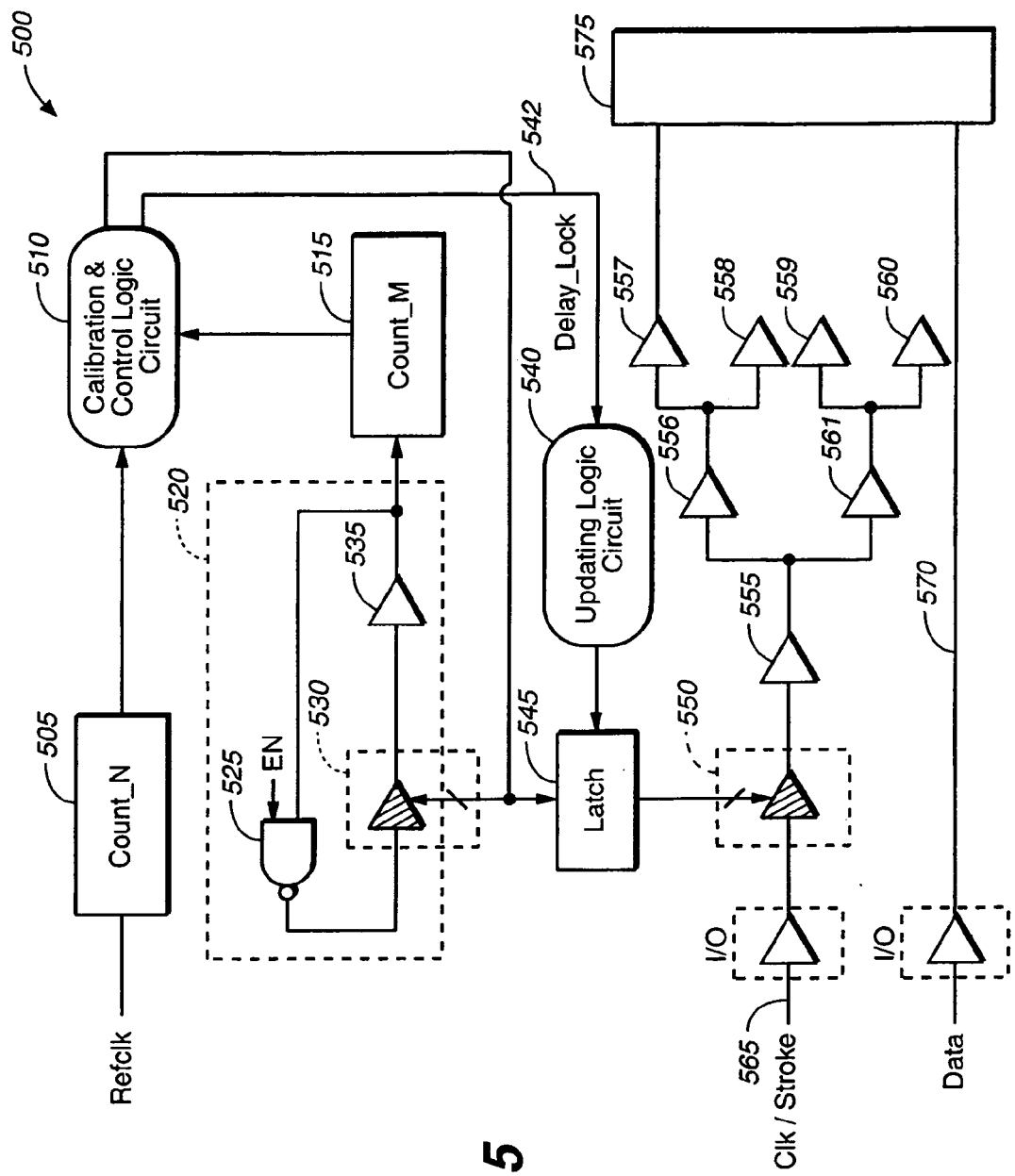
FIG._5

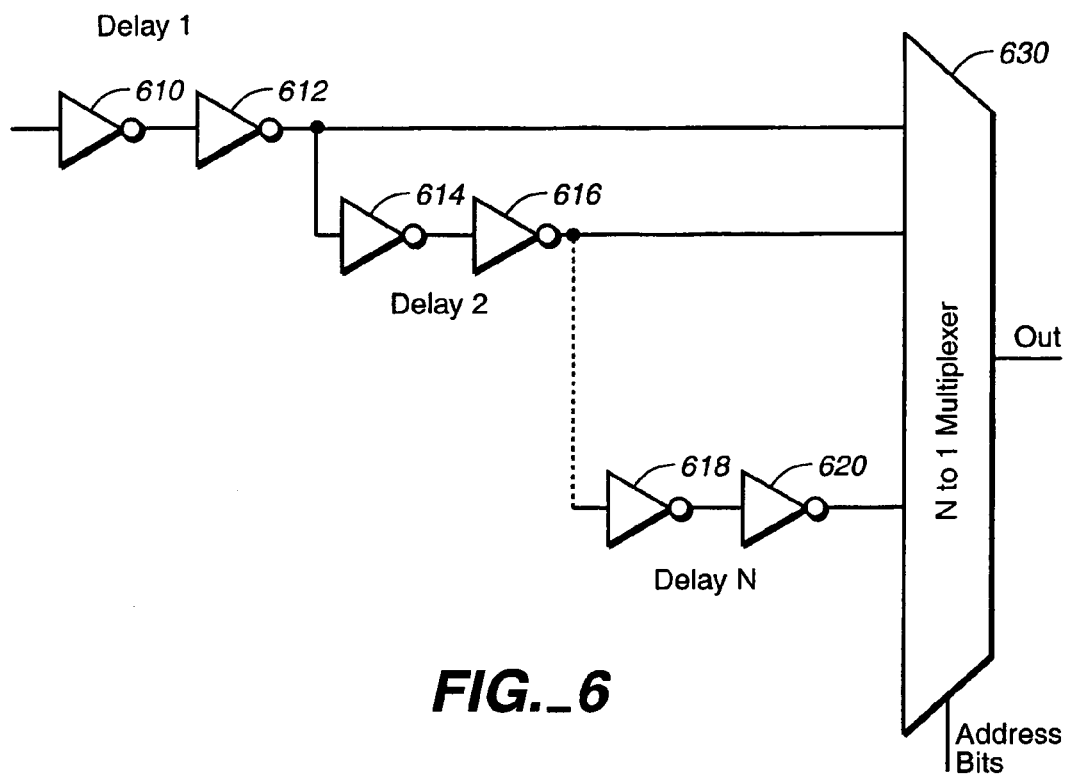
FIG._6

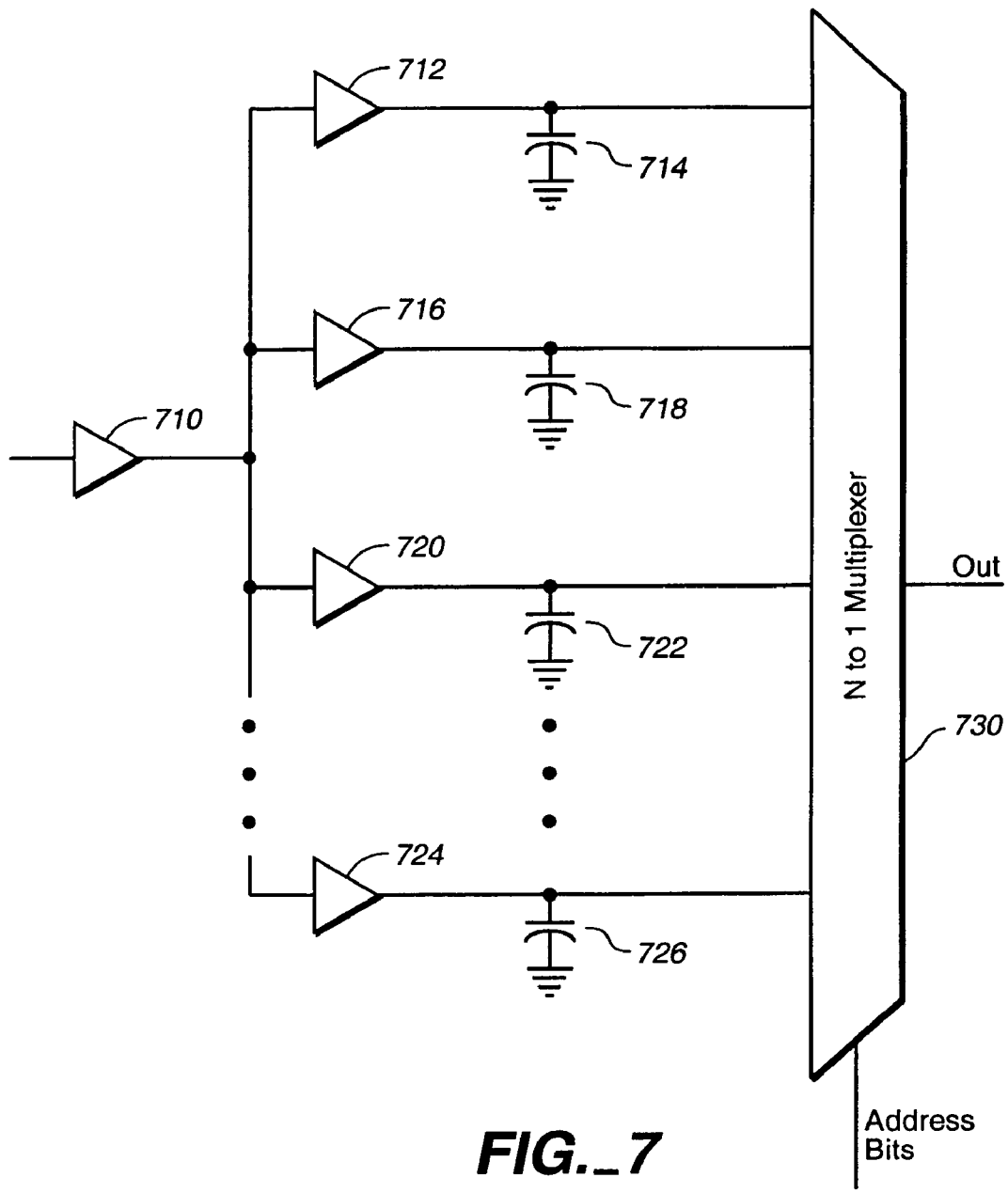
FIG._7

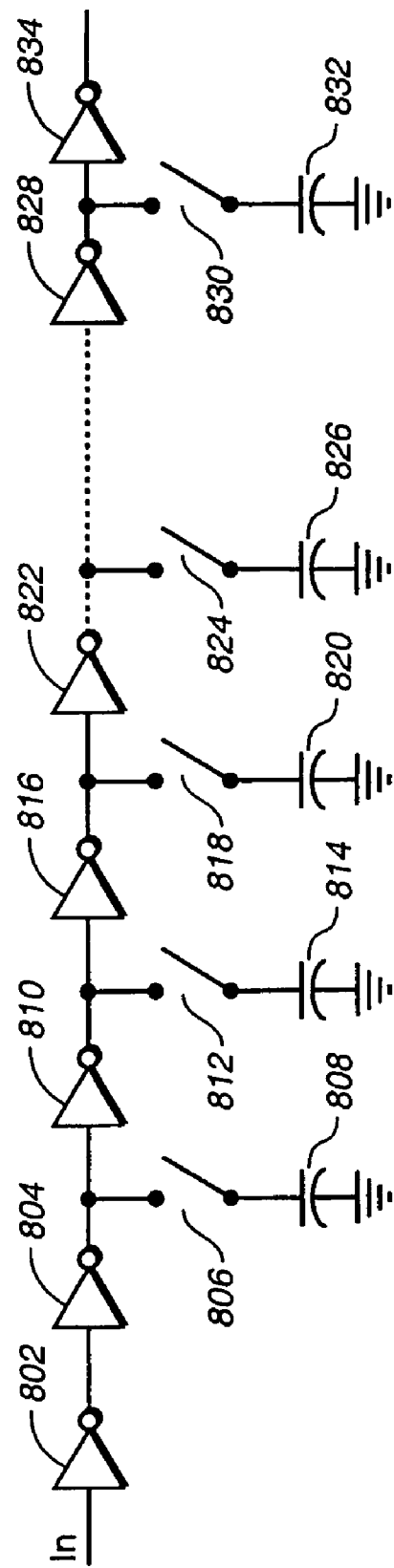
FIG._8

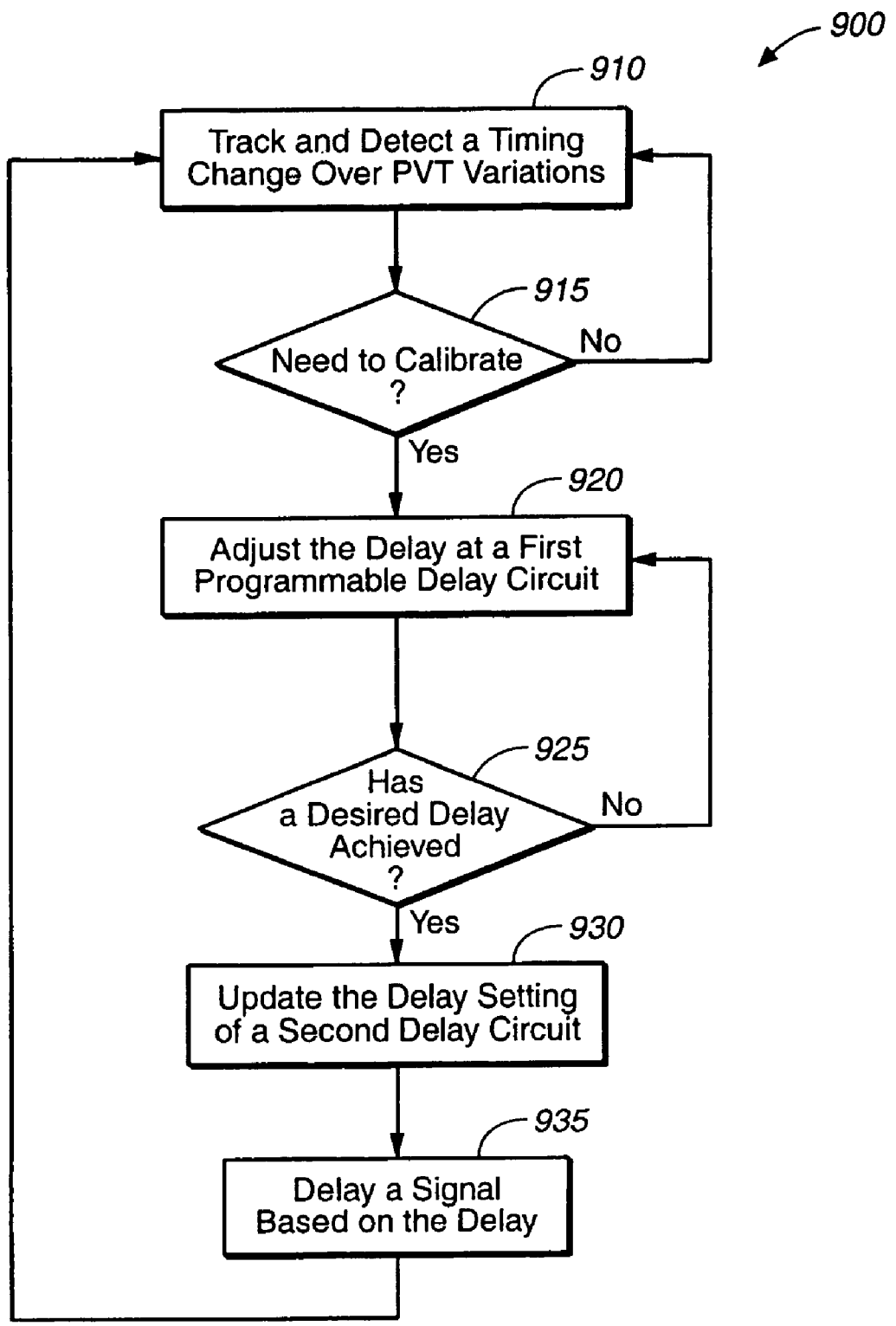
*FIG._9*

DIGITAL PROGRAMMABLE DELAY SCHEME TO CONTINUOUSLY CALIBRATE AND TRACK DELAY OVER PROCESS, VOLTAGE AND TEMPERATURE

CROSS REFERENCE TO RELATED APPLICATIONS

The present application is continuation-in-part of U.S. patent application Ser. No. 10/671,352, filed Sep. 25, 2003, now U.S. Pat. No. 6,914,492. Said U.S. patent application Ser. No. 10/671,352, filed Sep. 25, 2003 is hereby incorporated by reference in its entirety.

FIELD OF THE INVENTION

The present invention generally relates to the field of timing in integrated circuits, and particularly to controlling and tracking a delay over process, voltage and/or temperature for a high speed integrated circuit signal.

BACKGROUND OF THE INVENTION

In today's digital IC design, there is a strong need to shift delay of a clock signal to obtain phase relationship with other signals. A typical integrated circuit (IC) uses multiple individual clock signals having the same or different frequencies for operating various components of the integrated circuit. A phase error between clocks on an integrated circuit may induce performance degradation problems and functionality errors on the integrated circuit if the phase error exceeds a tolerable range. In order to minimize phase errors, the timing of a signal is set to a certain phase with respect to those clock signals on an IC or an application. However, due to the process, voltage level and temperature variations, the phase relationship may vary between similarly fabricated IC's or even among signals on a single IC. For example, the phase relationship will not remain even across chip on a single application or printed circuit board due to a temperature change.

After IC chips are fabricated and manufactured, the process of the die/chip is fixed for the IC chips. Thus timing change due the process can be compensated by one time calibration. However, the temperature and voltage in IC chips may vary after the calibration. The timing changes due to the temperature and voltage variations may affect the delay of the programmable delay cell and thus may compromise the performance of the system. Moreover, compensating for timing changes due to PVT after the calibration is difficult since the system must calibrated again to readjust the delay. In such a case, the system may have to stop its normal operation in order to calibrate. Most applications do not allow the system to stop its normal operation to perform calibrations.

Therefore, it would be advantageous to have a scheme which has ability to accurately place, adjust and continuously maintain the phase relationship between signals over PVT variations.

SUMMARY OF THE INVENTION

Accordingly, the present invention is directed to a method and circuit for tracking a timing change continuously and calibrating without an adverse impact on a system performance.

In the present invention, a first programmable delay circuit with automatic calibration includes a calibration and control logic circuit that receives a first signal generated in response to a reference clock and a second signal generated in response to an oscillator clock that is generated by an oscillator circuit. The oscillator circuit includes a first programmable delay cell receiving a delay set by the calibration and control logic circuit. A second programmable delay circuit includes an updating logic circuit that updates a second programmable delay cell via a latch based on the delay provided from the calibration/control logic circuit in the first programmable delay circuit. The second programmable delay circuit also includes a signal path having a second programmable delay cell that propagates the delay.

The present invention overcomes shortcomings of the current techniques. The present invention has the ability to track a timing change over process, voltage, and temperature variation (PVT) constantly. In an advantageous aspect, the present invention compensates the timing change over PVT continuously. When the system detects a timing change, the first programmable delay circuit may performs a delay locking process to correct a phase error caused by the timing change over PVT. Upon completion of the delay locking process, the calibration/control logic circuit may adjust the delay of the first programmable delay cell and send out the delay to the second programmable delay circuit. The delay to the signal path is adjusted by the second programmable delay cell in the second programmable delay circuit while the first programmable delay circuit is running continuously. Consequently, the system may continue its normal operation while the system readjusts its delay over PVT. In another advantageous aspect, the method and circuit of the present invention may only require small power and die area.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 illustrates a block diagram of an embodiment of a circuit of the present invention;

FIG. 2 illustrates a block diagram of an embodiment of a first programmable delay circuit;

FIG. 3 illustrates a timing diagram of the reference clock and oscillator clock representational waveforms of an embodiment of the present invention;

FIG. 4 illustrates a block diagram of an embodiment of a second programmable delay circuit;

FIG. 5 illustrates a schematic block diagram of an exemplary embodiment of a circuit in accordance with the present invention;

FIG. 6 illustrates a first embodiment of a programmable delay cell in which one of several delays is selected by a multiplexer;

FIG. 7 illustrates a second embodiment of a programmable delay cell in which one of several capacitive delays is selected by a multiplexer;

FIG. 8 illustrates a third embodiment of a programmable delay cell in which capacitances switchably connect an input of a stage in the programmable delay cell to ground; and FIG. 9 illustrates a flow diagram of a method of the present invention.

DETAILED DESCRIPTION OF THE INVENTION

Reference will now be made in detail to the presently preferred embodiments of the invention, examples of which are illustrated in the accompanying drawings.

The present invention relates to a method and circuit for compensating a timing change over PVT without having an adverse impact on the system's normal operation. In FIG. 1, the circuit preferably uses two programmable delay circuits which may have a Master/Slave relationship. A first programmable delay circuit (a master programmable delay circuit) 105 may be used as a main delay circuit that may be running and tracking the timing change constantly. The first programmable delay circuit may receive a reference clock 110 and an enable signal 120. The first programmable delay circuit sends a delay_lock signal 125 and a delay setting 126 to a second programmable delay circuit (a slave programmable delay circuit) 130 whenever the first programmable delay circuit 105 completes a delay locking process. The delay locking process will be explained in greater detail later. The second programmable delay circuit 130 may be a part of the real signal path. The second programmable delay circuit 130 may receive a clock signal 125 and delay the clock signal based on the delay setting 126 and send a delayed clock signal 135 to the various circuit components in the IC device. Since the delay setting of the second programmable delay circuit 130 is set by the first programmable delay circuit 105, the system may not need to stop normal operation to update or readjust its delay for PVT variations.

FIG. 2 shows a functional block diagram of an embodiment of the first programmable delay circuit in the present invention. As shown in FIG. 1, the first programmable delay circuit comprises two counters 210, 250, a calibration and control logic circuit 230, and an oscillator 260 that includes a first programmable delay cell 270 and a plurality of circuits 271–273. The first programmable delay cell 270 may be implemented through inverters, differential delay cells, buffers and multiplexers, or the like. The oscillator 260 is preferably a ring oscillator. The first counter 210 is clocked by a reference clock (REFCLK) and the second counter 250 is clocked by the clock generated by the ring oscillator. The first counter 10 and the second counter 50 are capable of counting up to a certain number and resetting to begin counting again. In one embodiment, the calibration and control logic circuit 230 starts both counters simultaneously and stops the counters simultaneously after a predetermined period of time. Then, the calibration and control logic circuit 230 compares the count values to determine the operating frequency of the oscillator clock with respect to the reference clock. Optionally, prior to the calibration and control logic circuit 230, combination logic 220 and 240 may be used to provide waveforms to the calibration and control logic. The waveforms will be discussed in greater detail in FIG. 3. The calibration and control logic circuit 230 may automatically adjust the delay of the first programmable delay cell each time the calibration and control logic circuit 230 completes the delay locking process. As such, each time the desired delay is achieved (delay locked), the calibration and control logic circuit 230 may send out the desired delay (the delay which is locked) to the second programmable delay circuit.

FIG. 3 shows a timing diagram relating inputs to the calibration and control logic circuit. The reference clock counter generated pulse N_out, one of the two illustrated inputs, is shown as having a duration of A*N where N represents the number of counts before reset by the reference clocked counter 10 and A represents the clock period of reference clock. The period of the reference clock is given as A nanoseconds although a different unit of time may be used, such as picoseconds, microseconds, or milliseconds. Thus, the duration of N_out (from the beginning to the end of the count) is A*N. Similarly, if the propagation delay of the ring oscillator is given as B nanoseconds (or other unit of time such that A and B are measured in the same units of time), then the period of the ring oscillator is given as 2*B nanoseconds. If the number of cycles Count_M counted by the ring oscillator counter is M, then the duration of M_out (from beginning to end of the count) is 2*B*M. The waveform M_out may be a low duty cycle waveform as shown in FIG. 3 in which the high level pulse occupies a relatively small portion of the count period or may be a 50—50 duty cycle waveform or a high duty cycle waveform.

The present invention uses the reference clock as a guide for locking a delay by setting the ring oscillator frequency through the first programmable delay cell in the ring oscillator. For example, if it is desired that the oscillator clock frequency be twice the reference frequency, the first programmable delay cell is set (to the closest approximation or exactly) to 90 degrees of the period A; in other words, B is set to A/4 (equation 1). If Duration_N equals Duration_M by adjusting the delay of the first programmable cell, then A*N=2*B*M (equation 2). Substituting B=A/4 yields M=2*N (equation 3). Thus, satisfying equations 1 and 2 provides equation 3. In the case where the desired programmable delay is 90 degrees, the counter value of Count_M is set equal to twice the number of Count_N. For the purposes of this example, the value of the left side of equation 2, A*N, is fixed. In order to satisfy equation 2, the value of B may be changed by adjusting the delay of the first programmable delay cell until 2*B*M equals A*N. In one embodiment, the calibration and control logic (or similar circuitry) detects the durations of Duration_N and Duration_M and sends control settings to adjust the delay of the first programmable delay cell until it finds the two durations are equal. Once equations 2 and 3 are satisfied, the propagation delay of the ring oscillator will be one fourth of the period of the reference clock A. For any given frequency of the reference clock, M and N can be properly chosen to get the desired phase shift/delay. Then the counters may be deactivated to save power as well as to reduce switching noise. PVT variations will not affect the counter values or the period of the reference clock (i.e., the values of M, N and A remain the same). In the case of multiple circuits, each delay network (or device) of an oscillator circuit will adjust the delay of the first programmable delay cell to satisfy equation 2. Thus, the value of B for different delay networks or different devices will still be the same regardless of the PVT conditions. Thus, B is the only variable for adjusting oscillator clock frequency and/or setting a delay.

FIG. 4 shows a block diagram of an embodiment of the second programmable delay circuit 400. The second programmable delay circuit 400 may include an updating logic circuit 405 where the calibration and control logic circuit in the first programmable delay circuit send out a delay_lock signal (indicating the delay lock process is completed). A latch 410 receives a desired delay from the calibration and control logic circuit in the first programmable delay circuit. Upon reception of delay_lock signal, the updating logic circuit 405 may update the delay setting of the second programmable delay cell 415 through the latch 410. The latch 410 is used to hold the desired delay for the second programmable delay cell 415. Alternatively, a shift register may be used to hold the desired delay for the second programmable delay cell 415. The second programmable delay cell 415 may be implemented through inverters, buffers, multiplexers or the like. The second programmable delay cell 415 may be a part of the clock signal path which comprises at least one clock buffer 420. The second programmable delay cell 415 may delay the clock signal based on the desired delay value. A delayed clock signal 430 may be outputted to various components in an IC.

FIG. 5 shows a functional block diagram of an embodiment of the circuit in which the delay scheme is embedded into a clock tree circuit. The ring oscillator 520 consists of a NAND gate 525, the first programmable delay cell 530, and a clock buffer 535. The reference clock may be provided by an off chip voltage controlled oscillator (VCO), a crystal oscillator, or the like, proximately disposed to the ring oscillator circuit. The resolution of the programmable delay buffer increments determines a number of cycles needed in a count cycle and the delay adjustment (or, deskew) capability. With reasonably sized counters, the circuit can accurately lock the delay. The accuracy may depend on the step size of the first programmable delay cell. The present invention can set the desired delay to within one step size and has the ability to calibrate the set delay for process, voltage, and temperature variations for every device used with it. Using current technology, designing a programmable delay cell may include the step sizes of 20 picoseconds or smaller.

The calibration and control logic circuit 510 preferably performs Boolean and arithmetic operations. During the calibration mode, the calibration and control logic circuit 510 continues to adjust the delay of the first programmable delay cell 530 until it finds the desired delay value. Consequently, the delay is adjusted to the timing change due to PVT. That eliminates the need of delay adjustment on the data path 570. Once the calibration and control logic circuit 510 locks a delay to compensate the timing change over PVT, it adjusts the delay setting of the first programmable delay cell 530 accordingly. Additionally, the calibration and control logic circuit 510 may send out the adjusted delay settings to the latch 545 and provide a delay_lock signal 542 to the updating logic circuit 540 indicating the completion of delay lock process. Upon reception of the delay_lock signal 542, the updating logic circuit 540 updates the delay setting of the second programmable delay cell 550 through the latch 545. The second programmable delay cell 550 is part of the real signal path comprising a clock tree.

The clock tree in FIG. 5 may have two, three, four, or more levels and may use temporary clock nets each of which are turned on or off independently. The clock tree may be implemented through various combinations of transistors, resistors, capacitors, flip flops, electrically erasable programmable read only memory, microcontroller, firmware, flash memory, and the like. Each level of the clock tree may be phase detectable and phase adjustable (or, skew detectable and skew adjustable).

Since the delay along the clock nets of the clock tree connected to the initial "clock" buffer may not be identical due to intra die interconnect process variations and due to different neighboring routes, the first level of clock buffers may not turn on at the same time. Additional differences in turn on times may be caused by intra die transistor variation, variations in signal line lengths, and differing capacitive effects. However, the input signal paths of each clock buffer 555-561 of a given level may be designed to be of the same length, to have a symmetric layout with other input signal paths of the same level, and to have a layout similar in other respects such as to experience various environmental affects, such as parasitic capacitance, in the same way and to the same degree. Thus, the clock signal into each level of clock buffer is presumed to be identical to the clock signal of the other clock buffers of the same level (e.g., 557-560). In other words, the clock buffer signal paths are balanced which results in fewer and minimal adjustments. The path distances of a clock tree may be balanced and symmetric to enhance the synchronization of the clock signals in different branches of the clock tree.

The first and second programmable delay cell may be implemented in numerous configurations. FIGS. 6-8 illustrate three examples of implementations of the first or second programmable delay cell. Features of the various implementations may be combined to achieve desired operational results. FIG. 6 shows a multiplexer 630 that selects one of N delays through the value of the address bits input to the multiplexer. Each delay each is formed of a pair of serial inverters 610-612, 614-616, and 618-620. FIG. 7 shows a multiplexer 730 that selects one of N delays determined by a selected input that is tied to a unique capacitive load in which a higher capacitive value leads to a greater delay value because of the RC time constant established by the selected capacitance 714, 718, 722, 726 and multiplexer switch input resistance. The first stage buffer 710 and second stage buffers 712, 716, 720, 724 may be inverters. FIG. 8 shows an embodiment in which the delay is formed of a fixed number of stages 802, 804, 810, 816, 822, 828, 834 in which the input of one or more of the stages may be switchable connected to a capacitance 808, 814, 820, 826, 832 through a switch 806, 812, 818, 824, 830. The capacitances 808, 814, 820, 826, 832 may be of the same capacitive value, may each be of a unique capacitance value, may have capacitive values scaled in relation to the other capacitors, or the like. Other variations of the programmable delay cell are also contemplated by the present invention.

FIG. 9 illustrates a flow diagram of an embodiment of a method of the present invention. The process 900 starts with the step in which the system tracks a timing change over PVT variations continuously and detects the timing change 910. The system determines whether another calibration is required to compensate the timing change 915. For example, the system may calculate the phase error caused by the timing change. If the phase error is over certain tolerable level, the system may determine to readjust its delay by performing a calibration to correct the phase error. Alternatively, the system may start readjusting the delay whenever there is a timing change due to PVT. If the system determines that a calibration is not necessary, the system may keep tracking a timing change over PVT 910 until a calibration is necessary. If the system determines that a calibration is necessary, the system starts adjusting the delay of the first programmable delay circuit 920. When a desired delay is achieved 925, the first programmable delay cell is set to have the desired delay and the calibration and control logic circuit sends out the desired delay and a delay_lock signal to the second programmable delay circuit. Upon reception of the delay_lock signal, the updating logic circuit updates the delay setting of the second programmable delay cell though the latch based on the desired delay 930. Then, the second programmable delay cell delays the real clock signal based on the desired delay 935. Otherwise, the system will adjust the delay until the desired delay is achieved 925.

Initially, the counters clocked by the reference clock and the oscillator clock are cleared or reset. A delay is loaded into a stage of the oscillator from the calibration and control circuit, through a latch loaded by an external device, or in another manner.

Both counters are enabled simultaneously through the release of the reset line. The oscillator clock may be derived from the reference clock or may be generated through a ring oscillator. After a period of time, the counting is stopped simultaneously for the two counters. The stopping may be a function of the reference clock counter reaching a certain count value. Likewise, the oscillator clocked counter may determine the end of the count period. Alternatively, the calibration and control logic circuit or other circuit may determine when to stop counting. The reference clocked count and the oscillator clocked count are compared. If the clocked count values are sent to the calibration and control logic, the comparison may be performed by an arithmetic logic unit or other circuitry. If reference clock counter generated pulse N_out and oscillator clock counter generated pulse M_out are sent to the calibration and control logic, the comparison may be performed using a shift register to measure the relative durations of the two pulses or a counting circuit may count the number of M_out pulses during the period of time N_out is a logic high value. If the oscillator clock frequency is determined to be within the desired parameters, such as within an acceptable range or of a desired value, the counters are reset and calibration stops. Otherwise, a new delay is determined and the new delay value is loaded into the first programmable delay cell of the oscillator, the counters are reset, and counting resumes.

The present invention may be practiced through a variety of implementations. For example, the counters of FIGS. 2 and 5 may be reset on a particular count, may be stopped by control logic, or may rollover continuously. The duty cycle of the waveforms generated from the counter outputs may be altered to comply with a particular application. An initial delay value may be preset at the time of manufacture, may be set by dual in line switches, may be loaded into the calibration and control logic circuitry, or may otherwise be input. The system may track a timing change continuously but calibrations may be employed only when the timing change is in an intolerable range. The reference clocked counter and the oscillator clocked counter preferably are reset together, but may be reset independently through the calibration and control logic, through an operator, or through other circuitry. The propagation delays of the counter and combination logic timed by the reference clock is preferably closely matched with or identical to the propagation delays of the counter and combination logic timed by the oscillator clock. Instead of combination logic that receives the count values and generates a corresponding waveform, the count may be provided directly to the calibration and control logic. An arithmetic logic unit may be used to compare the two count values.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A digitally programmable delay circuit, comprising:
   means for tracking a timing change over process, voltage and temperature variations;
   means for locking a desired delay based on a first clock signal and a second clock signal upon detection of said timing change and providing a delay_lock signal and said desired delay upon completion of delay lock process; and
   means for aligning a clock signal based on said desired delay, said means for aligning a clock signal receiving said delay_lock signal and said desired delay.

2. The digital programmable delay circuit as in claim 1, said means for locking said delay further comprising:
   means for receiving said first clock signal and providing a first output signal that is generated from said first clock signal;
   means for receiving said second clock signal and providing a second output signal that is generated from said second clock signal;
   means for receiving said first and second output signals, providing a third output signal based upon a relationship of said first and second output signals; and
   means for setting a delay based on said third output signal.

3. The digital programmable delay circuit of claim 2, wherein said means for receiving a first clock signal has a first propagation delay and said means for receiving a second signal has a second propagation delay, said first and second propagation delays being aligned.

4. The digital programmable delay circuit of claim 3, wherein said means for receiving a first clock signal includes a first counter and a first output logic circuit and said means for receiving a second clock signal includes a second counter and a second output logic circuit.

5. The digital programmable delay circuit of claim 4, wherein a propagation delay of said first output logic circuit approximately equals a propagation delay of said second output logic circuit.

6. The digital programmable delay circuit of claim 2, wherein said first clock signal is a reference clock signal.

7. The digital programmable delay circuit of claim 2, wherein said second clock signal is an oscillator clock signal.

8. The digital programmable delay circuit as in claim 1, said means for aligning a clock signal further comprising:
   means for updating at least one latch coupled to a programmable delay cell based on said desired delay upon reception of said delay_lock signal,
   wherein said programmable delay cell is part of a signal path.

9. The digital programmable delay circuit of claim 8, further comprising
   means for receiving said clock signal, said clock signal having a propagation delay based on said desired delay, said desired delay being held in said at least one latch.

10. A method for generating a delay to compensate for process, voltage and temperature variations in an IC, comprising steps of:
    generating a first signal in response to a reference clock;
    generating a second signal in response to an oscillator clock;
    comparing said first signal and said second signal;
    based on the comparison of said first and second signals and a desired delay, locking a delay of a first programmable delay circuit;
    providing said desired delay to an oscillator; and providing said desired delay and a delay_lock signal to a second programmable delay circuit in a signal path.

11. The method of claim 10, further comprising steps of:
receiving said desired delay via at least one latch;
upon reception of said delay_lock signal, updating a delay setting of a programmable delay cell in said second programmable delay circuit;
delaying a clock signal based on said updated delay setting; and
providing said delayed clock signal to a signal path, wherein said signal path includes a clock tree.

12. The method of claim 11, wherein said at least one latch includes a shift register.

13. The method of claim 10, further comprising a step of counting reference clock cycles as a first count value and generating said first signal through a Boolean operation using said first count value.

14. The method of claim 13, further comprising steps of:
counting oscillator clock cycles as a second count value; and
generating said second signal through a Boolean operation using said second count value.

15. The method of claim 10, further comprising a step of:
comparing count values of said first and second signals to determine if said desired delay is to be adjusted,
wherein said first and second signals include said count values.

16. The method of claim 10, further comprising a step of tracking a timing change over process, voltage and temperature variations.

17. The method of claim 10, wherein said oscillator includes a programmable delay cell receiving said desired delay.

18. The method of claim 10, wherein said oscillator is a ring oscillator.

19. A programmable delay circuit for compensating a timing change over process, voltage and temperature, comprising:
a calibration and control logic circuit that receives a first signal generated in response to a reference clock and a second signal generated in response to an oscillator clock upon a detection of said timing change over process, voltage and temperature variations;
an oscillator circuit that generates said oscillator clock, said oscillator circuit including a first programmable delay cell having a desired delay that is set by said calibration and control logic circuit;
a updating logic circuit receiving said delay_lock signal from said calibration and control logic circuit upon completion of delay lock process; and
a second programmable delay cell, coupled to a latch circuit, being updated by said updating logic circuit based on said desired delay, said latch receiving said desired delay from said calibration and control logic circuit,
wherein said second delay cell propagates a signal based on said delay.

20. The programmable delay circuit of claim 19, further comprising a first counting circuit that is timed by said reference clock and that generates said first signal.

21. The programmable delay circuit of claim 20, further comprising a second counting circuit that is timed by said oscillator clock and that generates said second signal.

22. The programmable delay circuit of claim 21, wherein said oscillator circuit includes a plurality of stages.

23. The programmable delay circuit of claim 22, wherein at least one of said plurality of stages is said first programmable delay cell.

24. The programmable delay circuit of claim 23, wherein at least one of said plurality of stages is a complementary metal oxide semiconductor inverter.

25. The programmable delay circuit of claim 24, wherein said oscillator is a ring oscillator.

26. The programmable delay circuit of claim 19, wherein said latch includes a shift register.

27. A method for generating a delay to compensate for Process, Voltage and Temperature variations in an IC, comprising steps of:
tracking said timing change over Process, Voltage and Temperature variations;
entering a desired delay for an oscillator clock;
generating said oscillator clock from an oscillator;
generating a first signal in response to a reference clock;
generating a second signal in response to said oscillator clock;
comparing count values of said first and second signals to determine if said desired delay has been achieved;
locking a delay based on said comparison of said count values of said first and second signals and said desired delay;
providing said desired delay to a first programmable delay cell in said oscillator;
providing said desired delay to a second programmable delay cell via at least one latch;
providing a delay_lock signal to an updating logic circuit upon completion of locking said delay;
providing a clock signal that is delayed by said second programmable delay cell, wherein said updating logic circuit updates a delay setting of said second programmable delay cell though at least one latch upon reception of said delay_lock signal.

28. The method of claim 27, further comprising counting reference clock cycles as a first count value and generating said first signal through a Boolean operation using said first count value.

29. The method of claim 28, further comprising counting oscillator clock cycles as a second count value and generating said second signal through a Boolean operation using said second count value.

30. The method of claim 27, wherein said oscillator is a ring oscillator.

31. The method of claim 27, wherein said latch includes at least one shifted register.

* * * * *